(12) United States Patent
Park et al.

(10) Patent No.: US 12,154,912 B2
(45) Date of Patent: Nov. 26, 2024

(54) DISPLAY DEVICE

(71) Applicant: Samsung Display Co., LTD., Yongin-si (KR)

(72) Inventors: Young Ok Park, Yongin-si (KR); Chung Han Shim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/455,299

(22) Filed: Aug. 24, 2023

(65) Prior Publication Data

US 2024/0162242 A1 May 16, 2024

(30) Foreign Application Priority Data

Nov. 16, 2022 (KR) .................. 10-2022-0153923

(51) Int. Cl.
*G09G 3/3233* (2016.01)
*H01L 27/12* (2006.01)

(52) U.S. Cl.
CPC ......... *H01L 27/124* (2013.01); *G09G 3/3233* (2013.01); *G09G 2300/0426* (2013.01); *G09G 2300/0819* (2013.01); *G09G 2300/0852* (2013.01); *G09G 2300/0861* (2013.01); *G09G 2310/0286* (2013.01); *G09G 2330/04* (2013.01)

(58) Field of Classification Search
CPC .. G09G 3/3674; G09G 3/3688; G09G 3/3648; G09G 3/006; G09G 3/3233; G09G 2330/04; G02F 1/136204; H01L 27/0248
See application file for complete search history.

(56) References Cited

U.S. PATENT DOCUMENTS

| | | |
|---|---|---|
| 5,689,133 A | 11/1997 | Li et al. |
| 6,970,336 B2 | 11/2005 | Stockinger et al. |
| 7,110,229 B2 | 9/2006 | Yang et al. |
| 7,893,899 B2 | 2/2011 | Jeong et al. |

(Continued)

FOREIGN PATENT DOCUMENTS

| | | |
|---|---|---|
| JP | 2021-063912 A | 4/2021 |
| KR | 10-0833768 B1 | 5/2008 |

(Continued)

OTHER PUBLICATIONS

Ker et al., "51.3: Successful Electrostatic Discharge Protection Design for LTPS Circuits Integrated on Panel", SID, vol. 34, Issue 1, pp. 1400-1403, Jul. 5, 2012.

*Primary Examiner* — Yuzhen Shen
(74) *Attorney, Agent, or Firm* — Lewis Roca Rothgerber Christie LLP

(57) ABSTRACT

A display device according to one or more embodiments of the disclosure includes a pixel on a base layer; a gate driver configured to supply a gate control signal to the pixel through a gate line; pads including a first pad on the base layer and electrically connected to the pixel through a data line and a second pad on the base layer and electrically connected to the gate driver; and a protection circuit electrically connected to the pads. The protection circuit includes a first protection circuit electrically connected between the first pad and the pixel and a second protection circuit electrically connected between the second pad and the gate driver. The first protection circuit and the second protection circuit have different structures.

14 Claims, 12 Drawing Sheets

(56) References Cited

U.S. PATENT DOCUMENTS

| | | | |
|---|---|---|---|
| 10,446,069 B2 | 10/2019 | Kim et al. | |
| 11,151,915 B2 | 10/2021 | Fujikawa | |
| 2003/0189542 A1* | 10/2003 | Lee | G09G 3/3677 |
| | | | 345/93 |
| 2008/0135846 A1* | 6/2008 | Shin | H01L 27/0248 |
| | | | 257/E27.111 |
| 2009/0108738 A1* | 4/2009 | Kwak | H10K 59/131 |
| | | | 313/504 |
| 2010/0238094 A1 | 9/2010 | Cho et al. | |
| 2015/0255409 A1* | 9/2015 | Lee | H01L 27/124 |
| | | | 257/59 |

FOREIGN PATENT DOCUMENTS

| | | |
|---|---|---|
| KR | 10-0993404 B1 | 11/2010 |
| KR | 10-2019-0096473 A | 8/2019 |

\* cited by examiner

GLn: GWLn, GRLn, GILn, EMLn
PL: PL1, PL2, PL3, PL4

PC: PC1, PC2

DISPLAY DEVICE

CROSS-REFERENCE TO RELATED APPLICATION

The present application claims priority to and the benefit of Korean Patent Application No. 10-2022-0153923, filed Nov. 16, 2022, the entire disclosure of which is incorporated herein by reference.

BACKGROUND

Field

Aspects of some embodiments of the present disclosure relate to a display device.

Discussion

A display device generally includes a data driver, a gate driver, and pixels. The data driver provides data signals to the pixels through data lines. The gate driver generates a gate signal using a gate power source and a clock signal provided from an external component, and sequentially provides the gate signal to the pixels through gate lines. Each of the pixels may write a corresponding data signal in response to the gate signal and emit light in response to the data signal.

Meanwhile, if static electricity flows into the display device from the outside, an internal circuit of the display device may malfunction or may be damaged due to the static electricity.

The above information disclosed in this Background section is only for enhancement of understanding of the background and therefore the information discussed in this Background section does not necessarily constitute prior art.

SUMMARY

Aspects of some embodiments of the present disclosure include a display device in which risks of damage due to static electricity can be substantially prevented or reduced by optimizing a static electricity protection circuit.

A display device according to one or more embodiments of the disclosure may include a pixel on a base layer; a gate driver configured to supply a gate control signal to the pixel through a gate line; pads including a first pad on the base layer and electrically connected to the pixel through a data line and a second pad on the base layer and electrically connected to the gate driver; and a protection circuit electrically connected to the pads. According to some embodiments, the protection circuit may include a first protection circuit electrically connected between the first pad and the pixel and a second protection circuit electrically connected between the second pad and the gate driver. According to some embodiments, the first protection circuit and the second protection circuit may have different structures.

According to one or more embodiments, the first pad may be configured to provide a data signal to the pixel through the data line. According to some embodiments, the second pad may be configured to provide the gate control signal to the gate driver through a gate control line.

According to one or more embodiments, the second protection circuit may be electrically connected to the gate driver through the gate control line.

According to one or more embodiments, the first protection circuit may be electrically connected to the pixel through the data line.

According to one or more embodiments, the gate driver may include a stage, a first gate power source line, a second gate power source line, a clock signal line, and a start signal line. According to some embodiments, the stage may be electrically connected to the first gate power source line, the second gate power source line, the clock signal line, and the start signal line. According to some embodiments, the stage may be configured to supply a gate signal to the gate line. According to some embodiments, a first gate power source voltage may be configured to be applied to the first gate power source line. According to some embodiments, a second gate power source voltage may be configured to be applied to the second gate power source line. According to some embodiments, a clock signal may be configured to be applied to the clock signal line. According to some embodiments, a start signal may be applied to the start signal line.

According to one or more embodiments, the clock signal line may be electrically connected to the second protection circuit.

According to one or more embodiments, the start signal line may be electrically connected to the second protection circuit.

According to one or more embodiments, the protection circuit may include a protection transistor including a first transistor and a second transistor. According to some embodiments, the first gate power source line may be electrically connected to the first transistor. According to some embodiments, the second gate power source line may be electrically connected to the second transistor.

According to one or more embodiments, in the first protection circuit, a transistor electrode of the protection transistor and a gate electrode of the protection transistor may be spaced apart from each other by a first distance in a plan view. According to some embodiments, in the second protection circuit, a transistor electrode of the protection transistor and a gate electrode of the protection transistor may be spaced apart from each other by a second distance in a plan view. According to some embodiments, the first distance may be smaller than the second distance.

According to one or more embodiments, the first distance may be 0.5 µm to 5.5 µm and the second distance may be 5.0 µm to 8.5 µm.

According to one or more embodiments, in the first protection circuit, an active layer of the protection transistor may have a first width. According to some embodiments, in the second protection circuit, an active layer of the protection transistor may have a second width. According to some embodiments, the first width may be greater than the second width.

According to one or more embodiments, the first width may be a width of a region in which first contact members for electrically connecting the active layer and the transistor electrode of the protection transistor in the first protection circuit are arranged. According to some embodiments, the second width may be a width of a region in which second contact members for electrically connecting the active layer and the transistor electrode of the protection transistor in the second protection circuit are arranged.

According to one or more embodiments, the first width and the second width may be defined according to a direction different from a direction in which a source electrode and a drain electrode of the protection transistor are spaced apart from each other.

According to one or more embodiments, the first width may be 40.0 µm to 90.0 µm and the second width may be 7.0 µm to 18.0 µm.

According to one or more embodiments, the protection circuit may be configured to receive a signal in the form of a pulse to discharge static electricity introduced into the pads.

BRIEF DESCRIPTION OF THE DRAWINGS

The accompanying drawings, which are included to provide a further understanding of the inventive concepts, and are incorporated in and constitute a part of this specification, illustrate aspects of some embodiments of the inventive concepts, and, together with the description, serve to explain aspects of some embodiments of the inventive concepts.

DETAILED DESCRIPTION

Figure 1:
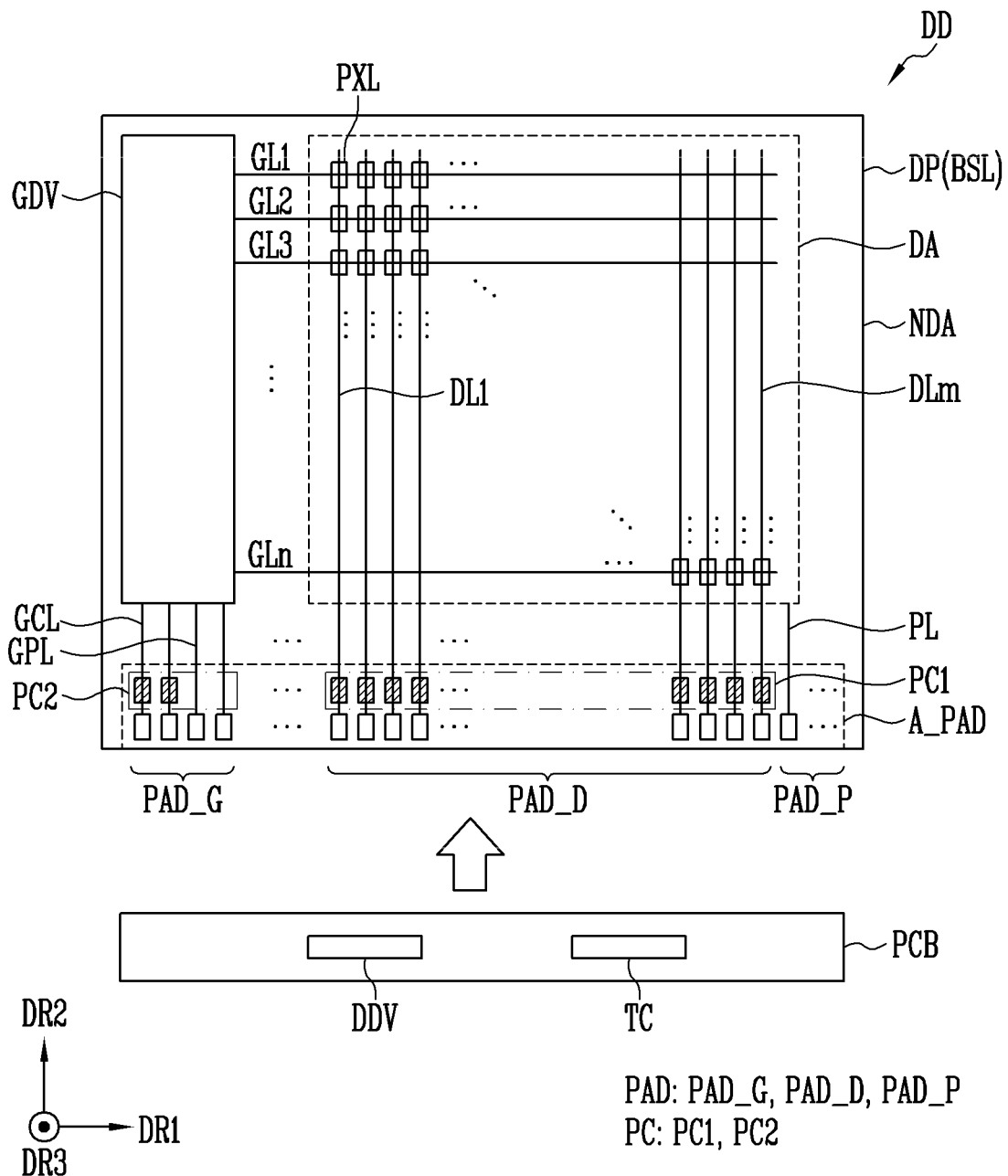
FIG. 1 is a block diagram schematically illustrating a display device according to one or more embodiments.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

It will be understood that, although the terms "first", "second", etc. may be used herein to describe various elements, these elements should not be limited by these terms. These terms are only used to distinguish one element from another element. For instance, a first element discussed below could be termed a second element without departing from the scope of the disclosure. Similarly, the second element could also be termed the first element. In the disclosure, the singular expressions are intended to include the plural expressions as well, unless the context clearly indicates otherwise.

It will be further understood that the terms "comprise", "include", "have", etc. used in the disclosure, specify the presence of stated features, integers, steps, operations, elements, components, or combinations of them but do not preclude the presence or addition of one or more other features, integers, steps, operations, elements, components, or combinations thereof. In addition, when a first part such as a layer, film, region, plat, etc. is "on" a second part, the first part may be not only "directly on" the second part but a third part may intervene between them. Furthermore, in the disclosure, when a first part such as a layer, film, region, plat, etc. is formed on a second part, a direction in which the first part is formed is not limited to an upper direction of the second part, but may include a side or a lower direction of the second part. To the contrary, when a first part such as a layer, film, region, plat, etc. is "under" a second part, the first part may be not only "directly under" the second part but a third part may intervene between them.

Aspects of some embodiments of the present disclosure relate to a display device. Hereinafter, further details of a display device according to one or more embodiments will be described with reference to the accompanying drawings.

FIG. 1 is a block diagram schematically illustrating a display device according to one or more embodiments.

Referring to FIG. 1, a display device DD may be configured to emit light. The display device DD may include a display panel DP, a gate driver GDV, a data driver DDV, and a timing controller TC.

The display panel DP may include a base layer BSL. The display panel DP (e.g., the base layer BSL) may include a display area DA at which images may be displayed and a non-display area NDA outside (e.g., in a periphery or outside a footprint) of the display area DA. A plurality of pixels PXL may be located in the display area DA. The gate driver GDV, pads PAD, and signal lines may be located in the non-display area NDA. The non-display area NDA may include a pad area A_PAD located on one side of the display area DA, and the pads PAD may be located in the pad area A_PAD.

The display panel DP may include gate lines GL1, GL2, GL3, . . . , and GLn, data lines DL1 to DLm, pixels PXL, and the pads PAD, where n and m may be positive integers. The gate lines GL1 to GLn may extend in a first direction DR1 and may be sequentially arranged along a second direction DR2. The data lines DL1 to DLm may extend in the second direction DR2 and may be sequentially arranged along the first direction DR1. The pixels PXL may be arranged or positioned in regions (for example, pixel regions) partitioned by the gate lines GL1 to GLn and the data lines DL1 to DLm, respectively. Each of the pixels PXL may be connected to at least one of the gate lines GL1 to GLn and/or one of the data lines DL1 to DLm.

In one or more embodiments, the display panel DP may further include the pads PAD and a protection circuit PC. The pads PAD may be connected to signal lines formed on the display panel DP, and may transfer signals provided from an external component or source to the signal lines.

In one or more embodiments, the pads PAD may include first pads PAD_D, second pads PAD_G, and power source pads PAD_P.

The first pads PAD_D may transfer data signals (or data voltages) to the data lines DL1 to DLm. The data signals may be provided from the data driver DDV.

The second pads PAD_G may transfer a gate control signal and a gate power source voltage to the gate driver GDV through a gate control line GCL and a gate power source line GPL.

Here, the gate control signal may include a start signal (or start pulse), clock signals, and the like, and may be provided from the timing controller TC. The gate power source voltage may be a power source voltage or a driving voltage necessary for the operation of the gate driver GDV, and may be provided from a power supply unit (for example, PMIC) or the data driver DDV. The gate power source voltage may include a first gate power source voltage having a turn-on level for turning on a transistor of the gate driver GDV and a second gate power source voltage having a turn-off level for turning off the transistor.

The power source pads PAD_P may transfer power source voltages (or pixel power source voltages) to a power source line PL (or pixel power source line). The power source voltages may be power source voltages or driving voltages necessary for the operation of the pixels PXL, and may be provided from the power supply unit.

The protection circuit PC may be provided or located in the non-display area NDA (or located adjacent to the pads PAD), and may be electrically connected to at least one of the pads PAD (or signal lines connected to the pads PAD).

The protection circuit PC may be electrically connected to a pad (or signal line) to which a signal in the form of a pulse or an AC signal is applied, may discharge static electricity (for example, surge) introduced from the outside through the pad, and may protect an internal circuit (or a display circuit, for example, the gate driver GDV connected to the pad through the signal lines, the pixels PXL) may be protected from static electricity. That is, the protection circuit PC may be an electrostatic discharge (ESD) circuit (or ESD protection circuit).

A plurality of protection circuits PC may be provided. According to one or more embodiments, the protection circuit PC may include a first protection circuit PC1 electrically connected to the first pads PAD_D and a second protection circuit PC2 electrically connected to the second pads PAD_G.

For example, the first protection circuit PC1 may be electrically connected to each of the data lines DL1 to DLm. Also, the second protection circuit PC2 may be electrically connected to the gate control line GCL to which the gate control signal (for example, the start signal and the clock signals) is applied.

Meanwhile, the protection circuit PC is shown as being located in the pad area A_PAD, but embodiments according to the present disclosure are not limited thereto. For example, the protection circuit PC may be located adjacent to an object to be protected (for example, the gate driver GDV or a pixel PXLnm). For example, the protection circuit PC may be arranged to be adjacent to both ends of the gate control line GCL, respectively.

The gate driver GDV may generate a gate signal based on the gate control signal and provide the gate signal to the gate lines GL1 to GLn. For example, the gate driver GDV may be implemented as a shift register that generates and outputs the gate signal by sequentially shifting the start signal in the form of a pulse using the clock signals.

The gate driver GDV may be connected to the timing controller TC through at least one circuit board PCB (for example, a flexible circuit board and/or a printed circuit board). The gate driver GDV may be formed on the display panel DP together with the pixels PXL, but embodiments according to the present disclosure are not limited thereto. For example, the gate driver GDV may be implemented as an integrated circuit and may be mounted on the circuit board PCB. Although the gate driver GDV is shown as being located in the non-display area NDA in FIG. 1, the gate driver GDV is not limited thereto. For example, the gate driver GDV may be distributed and located in the display area DA (for example, between the pixels PXL). The position of the gate driver GDV in the display panel DP is not limited to a specific position.

The data driver DDV may receive a data control signal and image data from the timing controller TC, generate the data signals corresponding to the image data, and provide the data signals to the display panel DP. For example, the data driver DDV may generate the data signals (or data voltages) corresponding to grayscale values of the image data and supply the data signals to the data lines DL1 to DLm in units of pixel rows.

The data driver DDV may be mounted on the circuit board PCB, connected to the timing controller TC, and connected to the data lines DL1 to DLm through data pads PAD_D.

The timing controller TC may control the gate driver GDV and the data driver DDV. The timing controller TC may receive input image data (for example, RGB data) and a control signal from an external device (for example, a graphic processor), generate the gate control signal and the data control signal based on the control signal, and generate the image data by converting the input image data. The control signal may include a vertical synchronization signal, a horizontal synchronization signal, a data enable signal, a reference clock signal, and the like. For example, the timing controller TC may convert the input image data into the image data having a format corresponding to the pixel arrangement of the display panel DP. The timing controller TC may be mounted on the circuit board PCB.

Meanwhile, the data driver DDV and the timing controller TC may be implemented as separate integrated circuits, but embodiments according to the present disclosure are not limited thereto. For example, the data driver DDV and the timing controller TC may be implemented as one integrated circuit.

As described above, the protection circuit PC may be electrically connected to at least one of the pads PAD of the display panel DP, for example, a pad (or signal line) to which a signal in the form of a pulse or an AC signal is applied, and may discharge static electricity introduced into the signal line.

Figure 2:
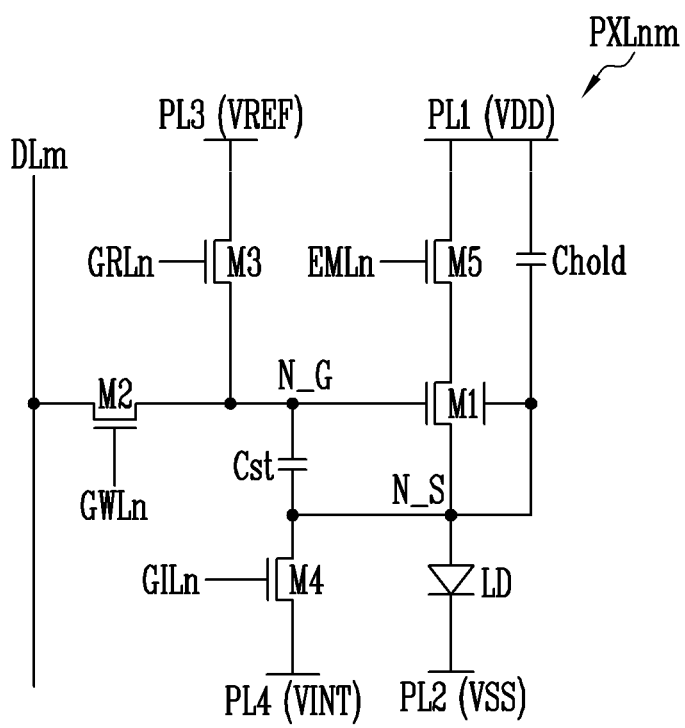
FIG. 2 is a circuit diagram illustrating a pixel included in the display device according to one or more embodiments.

FIG. 2 is a circuit diagram illustrating a pixel included in the display device according to one or more embodiments.

Referring to FIGS. 1 and 2, the pixel PXLnm may include a light emitting element LD and a pixel circuit electrically connected to the light emitting element LD. The pixel PXLnm may be electrically connected to a first power source line PL1, a second power source line PL2, a third power source line PL3, and a fourth power source line PL4. The first power source line PL1, the second power source line PL2, the third power source line PL3, and the fourth power source line PL4 may be included in or correspond to the power source line PL (refer to FIG. 1).

A first power source voltage VDD may be applied to the first power source line PL1, a second power source voltage VSS may be applied to the second power source line PL2, a third power source voltage VREF (or reference voltage) may be applied to the third power source line PL3, and a fourth power source voltage VINT (or initialization voltage) may be applied to the fourth power source line PL4. The first and second power source voltages VDD and VSS may be power source voltages or driving voltages required for the operation of the pixel PXLnm, and a voltage level of the first power source voltage VDD may be higher that a voltage level of the second power source voltage VSS.

The pixel PXLnm may be connected to the gate line GLn and the data line DLm. The gate line GLn may be included in the gate lines GL1 to GLn (refer to FIG. 1) or may correspond to at least one of the gate lines GL1 to GLn. The gate line GLn may include a write gate line GWLn, a compensation gate line GRLn, an initialization gate line GILn, and an emission control line EMLn.

The pixel PXLnm may include thin film transistors M1 to M5, a storage capacitor Cst, a hold capacitor Chold, and the light emitting element LD. Each of the thin film transistors M1 to M5 may be an N-type transistor. For example, each of the thin film transistors M1 to M5 may include an oxide semiconductor. However, embodiments according to the present disclosure are not limited thereto, and each of the thin film transistors M1 to M5 may include a silicon semiconductor (for example, LTPS).

A first thin film transistor M1 (or driving transistor) may include a first electrode connected to a second electrode of a fifth thin film transistor M5 (or connected to the first power source line PL1 through the fifth thin film transistor M5), a second electrode connected to a second pixel node N_S, a gate electrode connected to a first pixel node N_G, and a back-gate electrode connected to the second pixel node N_S. Here, the back-gate electrode may be arranged to overlap the gate electrode with an insulating layer interposed therebetween, may form or constitute a body of the corresponding transistor, and may function as a gate electrode. That is, the first thin film transistor M1 may be implemented as a back-gate transistor (or double gate transistor) further including the back-gate electrode.

The first thin film transistor M1 may control a driving current flowing from the first power source line PL1 to the second power source line PL2 through the light emitting element LD in response to a voltage of the first pixel node N_G.

As the back-gate electrode of the first thin film transistor M1 is connected to the second pixel node N_S, while the pixel PXLnm emits light, a voltage change of the second electrode (for example, a source electrode) of the first thin film transistor M1 may be transferred to the back-gate electrode as well. Accordingly, a voltage (for example, a gate-source voltage) between the second electrode and the gate electrode of the first thin film transistor M1 set through a compensation operation may be maintained, and the pixel PXLnm may emit light with a desired luminance.

A second thin film transistor M2 (or switching transistor) may include a first electrode connected to the data line DLm, a second electrode connected to the first pixel node N_G, and a gate electrode connected to the write gate line GWLn. The second thin film transistor M2 may be turned on in response to a write gate signal applied to the write gate line GWLn to electrically connect the data line DLm and the first pixel node N_G.

A third thin film transistor M3 (or compensation transistor) may include a first electrode connected to the third power source line PL3, a second electrode connected to the first pixel node N_G, and a gate electrode connected to the compensation gate line GRLn. The third thin film transistor M3 may be turned on in response to a compensation gate signal applied to the compensation gate line GRLn, and the first pixel node N_G may be initialized by the third power source voltage VREF.

A fourth thin film transistor M4 (or initialization transistor) may include a first electrode connected to the second pixel node N_S, a second electrode connected to the fourth power source line PL4, and a gate electrode connected to the initialization gate line GILn. The fourth thin film transistor M4 may be turned on in response to an initialization gate signal applied to the initialization gate line GILn, and the second pixel node N_S may be initialized by the fourth power source voltage VINT. A voltage difference between the third power source voltage VREF and the fourth power source voltage VINT may be greater than a threshold voltage of the fourth thin film transistor M4. For example, the third power source voltage VREF may be at a level of about 0V to 3V, and the fourth power source voltage VINT may be at a level of about −3V to 3V.

The fifth thin film transistor M5 (or light emitting transistor) may include a first electrode connected to the first power source line PL1, the second electrode connected to the first electrode of the first thin film transistor M1, and a gate electrode connected to the emission control line EMLn.

The fifth thin film transistor M5 may be turned off when an emission control signal is supplied to the emission control line EMLn, and may be turned on in other cases. When the fifth thin film transistor M5 is turned on, the first thin film transistor M1 may be electrically connected to the first power source line PL1.

The storage capacitor Cst may be formed or connected between the first pixel node N_G and the second pixel node N_S. The storage capacitor Cst may store a voltage difference between a voltage of the first pixel node N_G and a voltage of the second pixel node N_S. Also, the storage capacitor Cst may store a voltage based on the data signal.

The hold capacitor Chold may be formed or connected between the first power source line PL1 and the back-gate electrode of the first thin film transistor M1.

The light emitting element LD may be connected between the second pixel node N_S and the second power source line PL2, and may emit light with a luminance corresponding to the driving current provided through the first thin film transistor M1.

The light emitting element LD may include an organic light emitting diode or an inorganic light emitting diode such as a micro light emitting diode (LED) and a quantum dot light emitting diode. In addition, the light emitting element LD may be a light emitting element including an organic material and an inorganic material in combination. In FIG. 2, the pixel PXLnm includes a single light emitting element LD. However, according to some embodiments, the pixel PXLnm may include a plurality of light emitting elements, and the plurality of light emitting elements may be connected in series, in parallel, or in series and parallel.

A circuit structure of the pixel PXLnm according to one or more embodiments is not necessarily limited to the above examples, and the circuit structure of the pixel PXLnm may be variously changed. Additionally, the components of the circuit structure of the pixel PXLnm may vary in various embodiments. For example, according to various embodiments, there may be additional components or fewer components without departing from the spirit and scope of embodiments according to the present disclosure.

Figure 3:
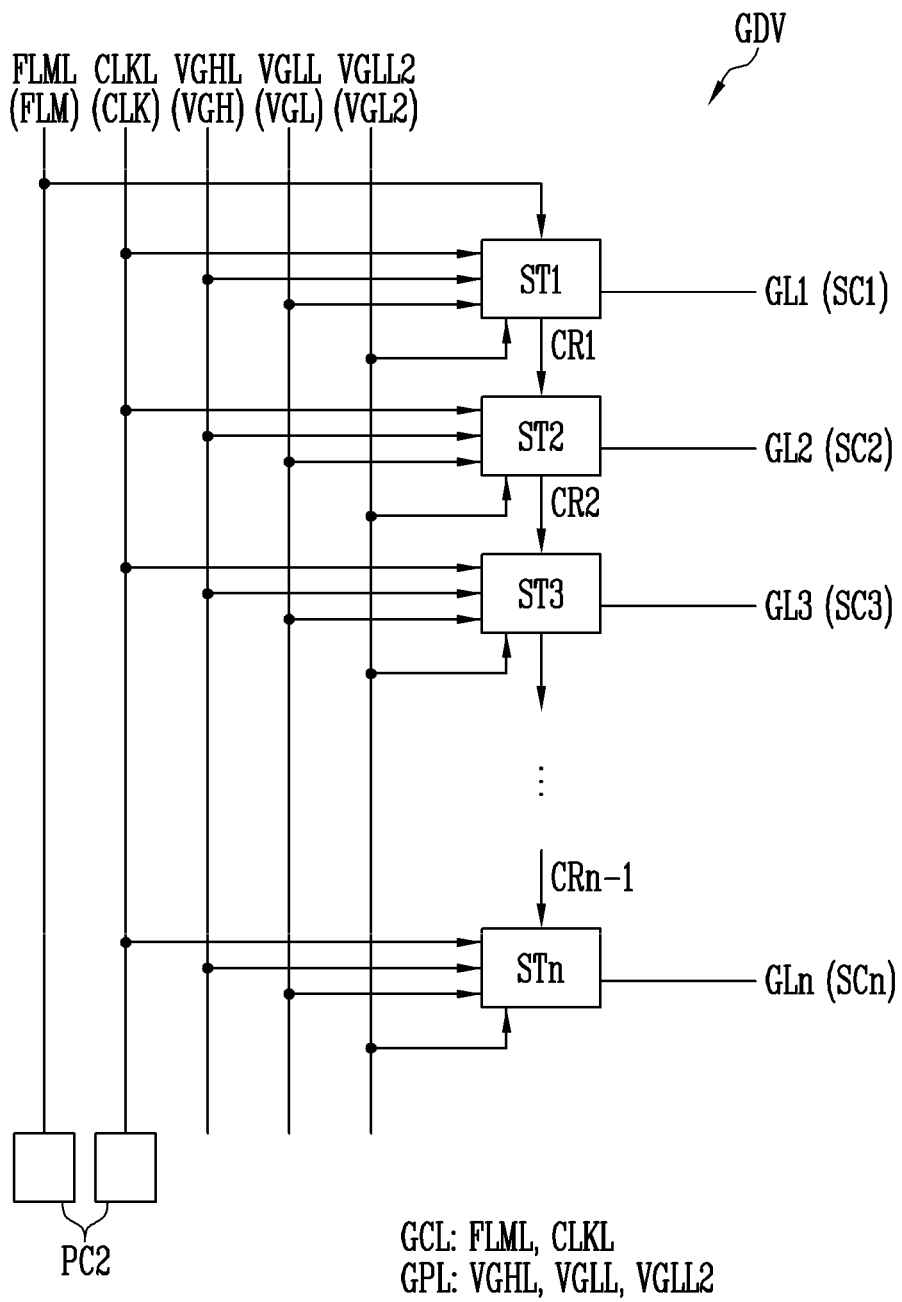
FIG. 3 is a diagram schematically illustrating a gate driver included in the display device according to one or more embodiments.

FIG. 3 is a diagram schematically illustrating a gate driver included in the display device according to one or more embodiments.

Referring to FIG. 3, the gate driver GDV may include a plurality of stages ST1, ST2, ..., and STn.

The stages ST1, ST2, ST3, ..., and STn may provide gate signals to the gate lines GL1, GL2, GL3, ..., and GLn, respectively. Here, each of the gate lines GL1 to GLn may correspond to at least one of the write gate line GWLn, the compensation gate line GRLn, the initialization gate line GILn, or the emission control line EMLn described with reference to FIG. 2.

Each of the stages ST1 to STn may be connected to a first gate power source line VGHL, a second gate power source line VGLL, a reference gate power source line VGLL2, and a clock signal line CLKL (or clock signal lines). Here, a first gate power source voltage VGH may be applied to the first gate power source line VGHL, a second gate power source voltage VGL may be applied to the second gate power source line VGLL, and a reference gate power source voltage VGL2 may be applied to the reference gate power source line VGLL2. The first gate power source line VGHL, the second gate power source line VGLL, and the reference gate power source line VGLL2 may be included in the gate power source line GPL.

The first gate power source voltage VGH may have a high voltage level or may be maintained at a high voltage level, and the second gate power source voltage VGL may have a low voltage level or may be maintained at a low voltage level. The high voltage level may be higher than the low voltage level. The reference gate power source voltage VGL2 may have a lower voltage level than the second gate power source voltage VGL. A clock signal CLK (or clock signals) may be applied to the clock signal line CLKL. According to one or more embodiments, the clock signal CLK may alternately have a turn-on level ON (or high voltage level) and a turn-off level OFF (or low voltage level). A start signal FLM (or start pulse) may be applied to a start signal line FLML. According to one or more embodiments, the start signal FLM may have a turn-on level pulse. The clock signal line CLKL and the start signal line FLML may be included in the gate control line GCL.

Each of the stages ST1 to STn may be connected to the start signal line FLML or a carry line, and may generate the gate signal corresponding to the start signal FLM provided through the start signal line FLML and a previous gate signal of a previous stage.

For example, a first stage ST1 may be connected to the start signal line FLML to generate a first gate signal SC1 corresponding to the start signal FLM. According to one or more embodiments, the first gate signal SC1 may be delayed by half a cycle of the clock signal CLK compared to the start signal FLM, but embodiments according to the present invention are not limited thereto. For example, a second stage ST2 may receive the first gate signal SC1 (or a first carry signal corresponding to the first gate signal SC1) from the first stage ST1 through a first carry line CR1, and generate a second gate signal SC2 corresponding to the first gate signal SC1. For example, a third stage ST3 may receive the second gate signal SC2 (or a second carry signal corresponding to the second gate signal SC2) from the second stage ST2 through a second carry line CR2, and generate a third gate signal SC3 corresponding to the second gate signal SC2. Similarly, an n-th stage STn may receive a previous gate signal (or an (n−1)th carry signal corresponding to the previous gate signal) from a previous stage through an (n−1)th carry line CRn−1, and generate an n-th gate signal SCn corresponding to the previous gate signal. According to one or more embodiments, the stages ST1 to STn may sequentially generate the gate signals SC1 to SCn corresponding to the start signal FLM.

Meanwhile, the second protection circuit PC2 may be electrically connected to the start signal line FLML to which the start signal FLM in the form of a pulse is applied. Also, according to some embodiments, the second protection circuit PC2 may be electrically connected to the clock signal line CLKL to which the clock signal CLK in the form of AC is applied. As described with reference to FIG. 1, the protection circuit PC may be located in front of the gate driver GDV to discharge static electricity introduced into the start signal line FLML and/or the clock signal line CLKL. According to one or more embodiments, the clock signal line CLKL may not be electrically connected to the first protection circuit PC1. The start signal line FLML may not be electrically connected to the first protection circuit PC1.

Figure 4:
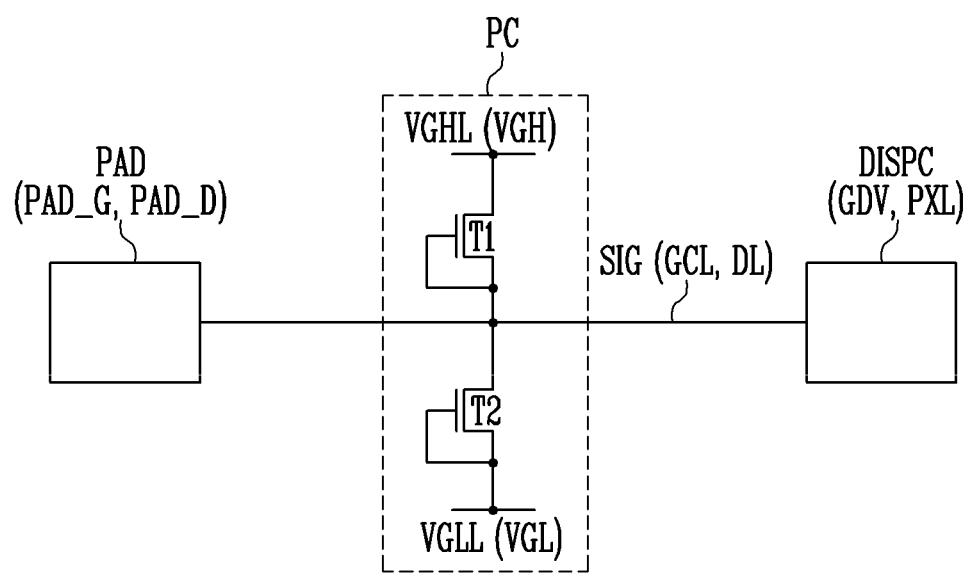
FIGS. 4 and 5 are diagrams schematically illustrating embodiments of a protection circuit included in the display device according to one or more embodiments.
Figure 5:
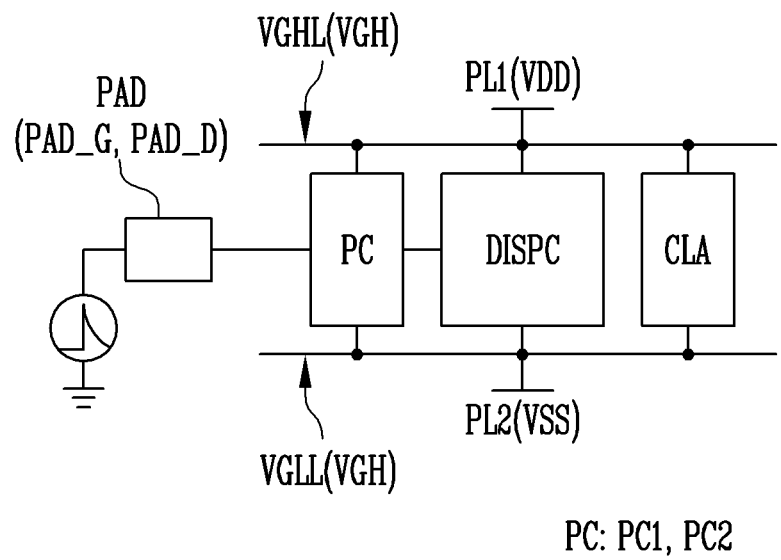
Figure 6:
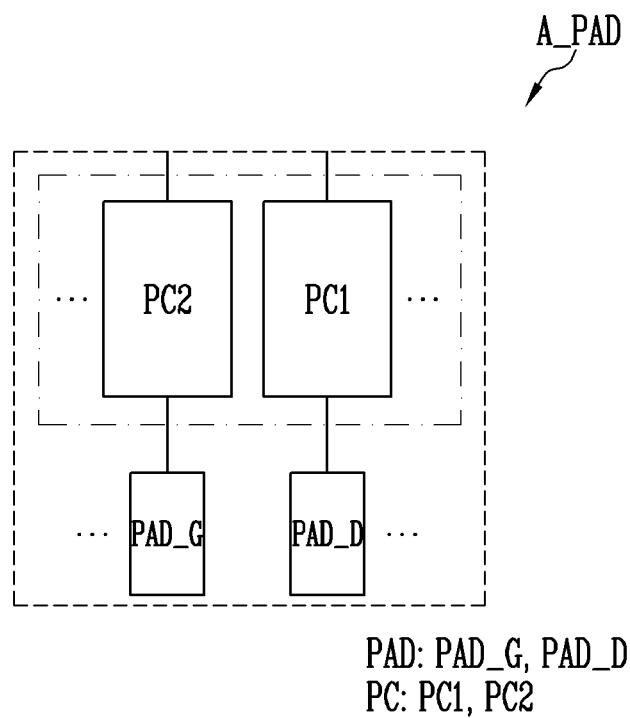
FIG. 6 is a plan view schematically illustrating a first protection circuit and a second protection circuit according to one or more embodiments.

FIGS. 4 and 5 are diagrams schematically illustrating aspects of a protection circuit included in the display device according to one or more embodiments. FIG. 6 is a plan view schematically illustrating a first protection circuit and a second protection circuit according to one or more embodiments.

Referring to FIGS. 4 to 6, a signal line SIG may connect a pad PAD and a display circuit DISPC (or internal circuit), and the protection circuit PC (or ESD circuit) may be connected to the signal line SIG. For example, the signal line SIG may be the gate control line GCL, the protection circuit PC may be the second protection circuit PC2, the pad PAD may be the second pad PAD_G, and the display circuit DISPC may be the gate driver GDV (a circuit included in the gate driver GDV). As another example, the signal line SIG may be the data line DL, the protection circuit PC may be the first protection circuit PC1, the pad PAD may be the first pad PAD_D, and the display circuit DISPC may be the pixel PXLnm (or a pixel circuit included in the pixel PXLnm). According to one or more embodiments, the first protection circuit PC1 and the second protection circuit PC2 may have different structures. Details regarding this will be described with reference to the drawings after FIG. 10.

A signal within a range of the first gate power source voltage VGH to the second gate power source voltage VGL may be applied to the signal line SIG. In other words, the first gate power source voltage VGH and the second gate power source voltage VGL may be determined by a voltage range of a signal applied to the signal line SIG. According to one or more embodiments, the first gate power source line VGHL may be electrically connected to the first power source line PL1 to supply the first power source voltage VDD, and the second gate power source line VGLL may be electrically connected to the second power source line PL2 to supply the second power source voltage VSS. According to one or more embodiments, a clamping circuit CLA may be further utilized. The clamping circuit CLA may be electrically connected to the first gate power source line V"HL a'd the second gate power source line VGLL.

The protection circuit PC may include a first transistor T1 and a second transistor T2. The first transistor T1 and the second transistor T2 may be referred to as a static electricity protection transistor or a protection transistor.

Figure 9:
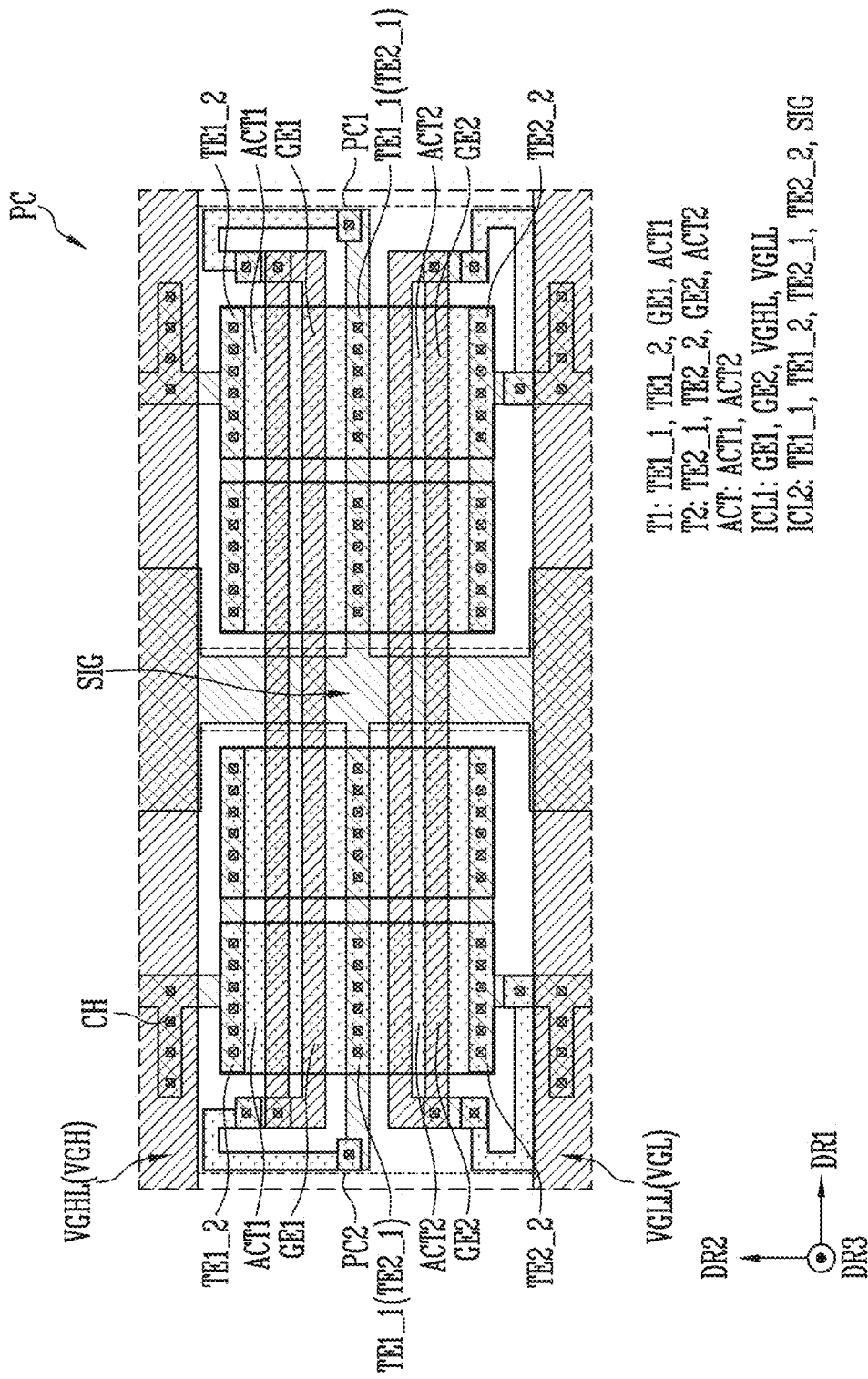

A first electrode (for example, a (1_2)th transistor electrode TE1_2 of FIG. 9) of the first transistor T1 may be electrically connected to the first gate power source line VGHL (or a first voltage line), a second electrode (for example, a (1_1)th transistor electrode TE1_1 of FIG. 9) of the first transistor T1 may be electrically connected to the signal line SIG, and a gate electrode (for example, a first gate electrode GE1 of FIG. 9) of the first transistor T1 may be electrically connected to the signal line SIG.

When a voltage higher than the first gate power source voltage VGH (or a first voltage) is applied to the signal line SIG due to static electricity, the first transistor T1 may be turned on. For example, the first transistor T1 may be turned on in response to a voltage difference between the first gate electrode GE1 and the (1_1)th transistor electrode TE1_1 of the first transistor T1. In this case, a current (for example, current due to the static electricity) may flow from the signal line SIG to the first gate power source line VGHL, and a voltage of the signal line SIG may decrease. That is, the first transistor T1 may drop a voltage higher than the first gate power source voltage VGH.

A first electrode (for example, a (2_1)th transistor electrode TE2_1 of FIG. 9) of the second transistor T2 may be electrically connected to the signal line SIG, a second electrode (for example, a (2_2)th transistor electrode TE2_2 of FIG. 9) of the second transistor T2 may be electrically connected to the second gate power source line VGLL (or a second voltage line), and a gate electrode (for example, a second gate electrode GE2) of the second transistor T2 may be electrically connected to the second gate power source line VGLL.

When a voltage lower than the second gate power source voltage VGL (or a second voltage) is applied to the signal line SIG due to static electricity, the second transistor T2 may be turned on. For example, the second transistor T2 may be turned on in response to a voltage difference between the second gate electrode GE2 and the (2_1)th transistor electrode TE2_1 of the second transistor T2. In this case, a current may flow from the second gate power source line VGLL to the signal line SIG, and the voltage of the signal line SIG may increase. That is, the second transistor T2 may raise a voltage lower than the second gate power source voltage VGL.

The voltage of the signal line SIG may be maintained at a voltage between the first gate power source voltage VGH and the second gate power source voltage VGL by the first transistor T1 and the second transistor T2, and the display circuit DISPC may be protected from the static electricity.

A structure of the protection circuit PC according to one or more embodiments is not necessarily limited to the examples described above. For example, the protection circuit PC may further include a transistor and a storage capacitor.

Hereinafter, a stacked structure of the display device DD according to one or more embodiments will be described with reference to FIGS. 7 to 13. Descriptions of contents that may overlap with the above contents are not simplified or repeated.

Figure 7:
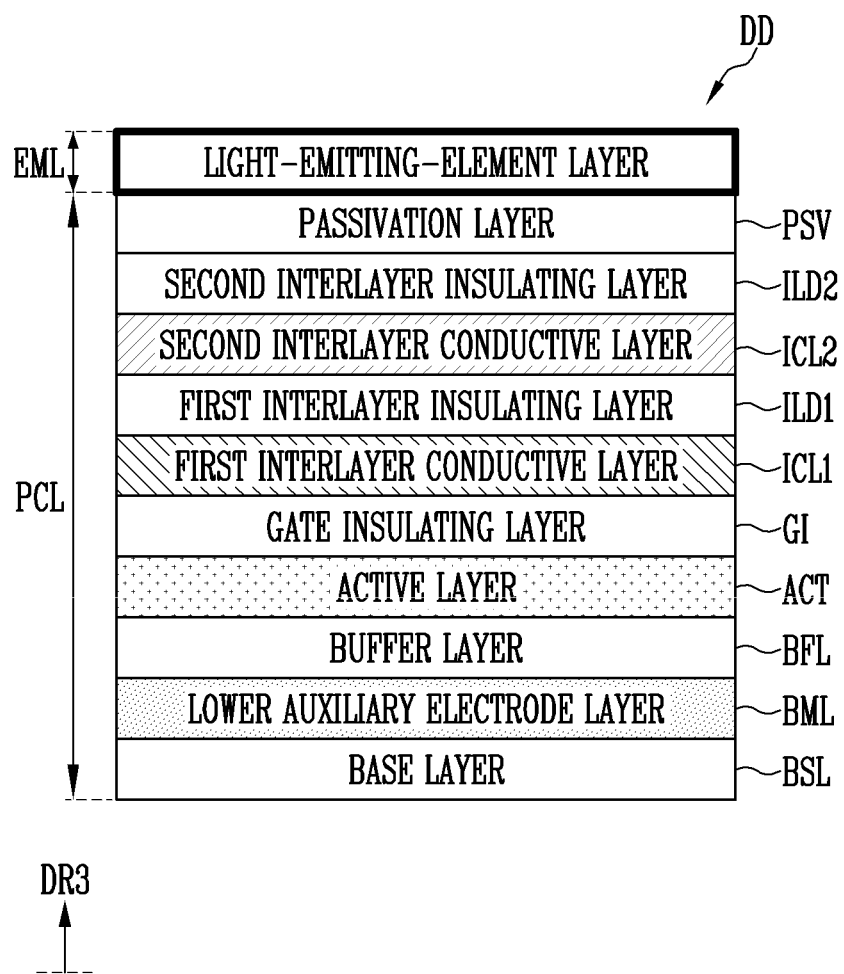
FIG. 7 is a schematic cross-sectional view for explaining a stacked structure of the display device according to one or more embodiments.

FIG. 7 is a schematic cross-sectional view for explaining a stacked structure of the display device according to one or more embodiments.

Referring to FIG. 7, a stack structure included in the display device DD according to one or more embodiments may include a pixel circuit layer PCL and a light emitting element layer EML. The pixel circuit layer PCL may have a structure in which a base layer BSL, a lower auxiliary electrode layer BML, a buffer layer BFL, an active layer ACT, a gate insulating layer GI, a first interlayer conductive layer ICL1, a first interlayer insulating layer ILD1, a second interlayer conductive layer ICL2, a second interlayer insulating layer ILD2, and a passivation layer PSV are sequentially stacked and at least a portion thereof is patterned.

According to one or more embodiments, the electrode layers described above may be patterned as a structure to form the pads PAD, the protection circuit PC, the display circuit DISPC, and signal lines SIG. The light emitting element layer EML may be a layer including the light emitting element LD.

The base layer BSL may form (or constitute) a base surface of the display device DD. As described above, the base layer BSL may include various materials, and examples thereof are not particularly limited.

The buffer layer BFL may be a layer for preventing or reducing instances of contaminants, impurities, or moisture diffusing or penetrating into the active layer ACT including a semiconductor. According to one or more embodiments, the buffer layer BFL may include one or more selected from the group consisting of silicon nitride (SiNx), silicon oxide (SiOx), silicon oxynitride (SiOxNy), and aluminum oxide (AlOx). However, embodiments according to the present disclosure are not necessarily limited to the above examples.

The active layer ACT may include a semiconductor. For example, the active layer ACT may include one or more selected from the group consisting of polysilicon, low temperature polycrystalline silicon (LTPS), amorphous silicon, and an oxide semiconductor.

The active layer ACT may form channels of transistors of the pixel PXL, the gate driver GDV, and the protection circuit PC. In addition, impurities may be doped in portions of the active layer ACT that contacts source and drain electrodes of each transistor.

The lower auxiliary electrode layer BML, the first interlayer conductive layer ICL1, and the second interlayer conductive layer ICL2 may include a conductive material. According to one or more embodiments, each of the lower auxiliary electrode layer BML, the first interlayer conductive layer ICL1, and the second interlayer conductive layer ICL2 may include one or more conductive layers.

According to one or more embodiments, each of the lower auxiliary electrode layer BML, the first interlayer conductive layer ICL1, and the second interlayer conductive layer ICL2 may include one or more selected from the group consisting of gold (Au), silver (Ag), aluminum (Al), molybdenum (Mo), chromium (Cr), titanium (Ti), nickel (Ni), neodymium (Nd), copper (Cu), and platinum (Pt). However, embodiments according to the present disclosure are not necessarily limited to the above examples.

The gate insulating layer GI, the first interlayer insulating layer ILD1, and the second interlayer insulating layer ILD2 may be located on the active layer ACT, the first interlayer conductive layer ICL1, and the second interlayer conductive layer ICL2. The passivation layer PSV may be located on the second interlayer insulating layer ILD2.

According to one or more embodiments, at least two selected from among the lower auxiliary electrode layer BML, the active layer ACT, the first interlayer conductive layer ICL1, and the second interlayer conductive layer ICL2 may be electrically connected to each other through a contact member CH (refer to FIG. 9) formed in at least one of the gate insulating layer GI, the first interlayer insulating layer ILD1, or the second interlayer insulating layer ILD2.

The gate insulating layer GI, the first interlayer insulating layer ILD1, and the second interlayer insulating layer ILD2 may include an inorganic material. The passivation layer PSV may include an organic material. The passivation layer PSV may be a via layer. However, embodiments according to the present disclosure are not necessarily limited to specific examples.

Next, a structure of electrodes for forming the protection circuit PC will be described with reference to FIGS. 8 to 13. In the following drawings, the same layers as the layers described with reference to FIG. 7 (for example, layers patterned in the same process) may be expressed as being patterned identically to each other.

Figure 8:
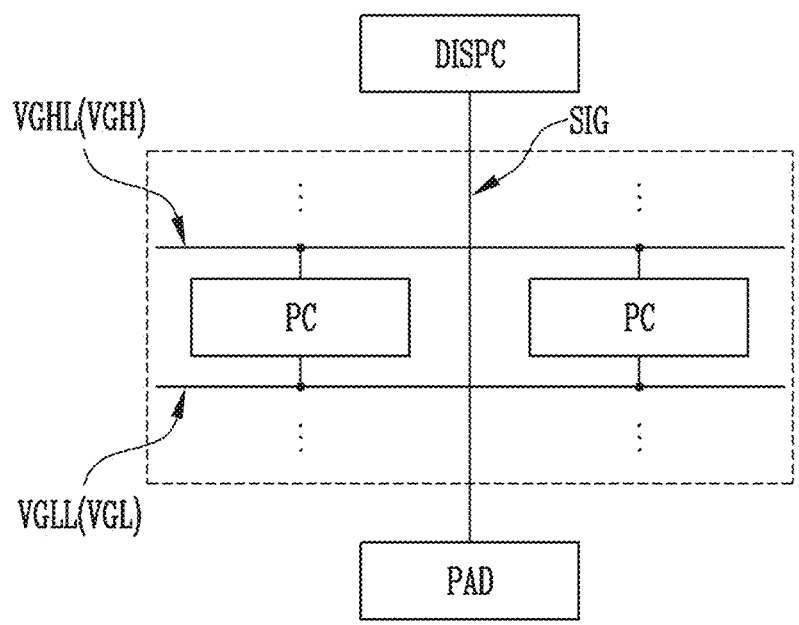
FIGS. 8 and 9 are plan views schematically illustrating an electrode structure of the protection circuit according to one or more embodiments.
Figure 8:
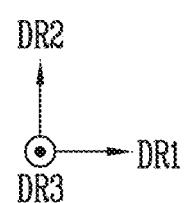

First, common technical features of the first protection circuit PC1 and the second protection circuit PC2 will be described with reference to FIGS. 8 and 9. FIGS. 8 and 9 are plan views schematically illustrating an electrode structure of the protection circuit according to one or more embodiments. The protection circuit PC shown in FIGS. 8 and 9 may be the first protection circuit PC1 or the second protection circuit PC2.

FIG. 9 shows the active layer ACT, the first interlayer conductive layer ICL1, and the second interlayer conductive layer ICL2. In FIG. 9, contact members CH for electrically connecting different patterns (for example, the active layer ACT, the first interlayer conductive layer ICL1, and the second interlayer conductive layer ICL2) are shown as squares marked with X.

According to one or more embodiments, the protection circuits PC may electrically connect the pads PAD and the display circuit DISPC. A plurality of protection circuits PC may be provided, and a part of the protection circuits PC may be connected between the first gate power source line VGHL and the second gate power source line VGLL at one side of the signal line SIG. Another part of the protection circuits PC may be connected between the first gate power source line VGHL and the second gate power source line VGLL at the other side of the signal line SIG.

In each of the protection circuits PC, the first transistor T1 may include the (1_1)th transistor electrode TE1_1, the (1_2)th transistor electrode TE1_2, a first active layer ACT1, and the first gate electrode GE1.

The (1_1)th transistor electrode TE1_1 may be formed of the second interlayer conductive layer ICL2 and may form a drain electrode of the first transistor T1. The (1_2)th transistor electrode TE1_2 may be formed of the second interlayer conductive layer ICL2 and may form a source electrode of the first transistor T1. The first gate electrode GE1 may be formed of the first interlayer conductive layer ICL1. The first gate electrode GE1 may overlap the first active layer ACT1. The first active layer ACT1 may be formed of the active layer ACT and may be electrically connected to the (1_1)th transistor electrode TE1_1 and the (1_2)th transistor electrode TE1_2.

In each of the protection circuits PC, the second transistor T2 may include the (2_1)th transistor electrode TE2_1, the (2_2)th transistor electrode TE2_2, a second active layer ACT2, and the second gate electrode GE2.

The (2_1)th transistor electrode TE2_1 may be formed of the second interlayer conductive layer ICL2 and may form a drain electrode of the second transistor T2. The (2_2)th transistor electrode TE2_2 may be formed of the second interlayer conductive layer ICL2 and may form a source electrode of the second transistor T2. The second gate electrode GE2 may be formed of the first interlayer conductive layer ICL1. The second gate electrode GE2 may overlap the second active layer ACT2 in a plan view. The second active layer ACT2 may be formed of the active layer ACT and may be electrically connected to the (2_1)th transistor electrode TE2_1 and the (2_2)th transistor electrode TE2_2.

The first gate power source line VGHL may be formed of the first interlayer conductive layer ICL1 and may extend along the first direction DR1. The first gate power source line VGHL may be electrically connected to the (1_2)th transistor electrode TE1_2 through the contact member CH.

The second gate power source line VGLL may be formed of the first interlayer conductive layer ICL1 and may extend along the first direction DR1. The second gate power source line VGLL may be electrically connected to the (2_2)th transistor electrode TE2_2 through the contact member CH.

The signal line SIG may be formed of the second interlayer conductive layer ICL2 and generally extend along the second direction DR2. The signal line SIG may be electrically connected to the (1_1)th transistor electrode TE1_1 and the (2_1)th transistor electrode TE2_1 through the contact member CH.

Next, technical features comparing the first protection circuit PC1 and the second protection circuit PC2 will be described with reference to FIGS. 10 to 13. Descriptions of contents that may overlap with the above contents are not simplified or repeated.

Figure 10:
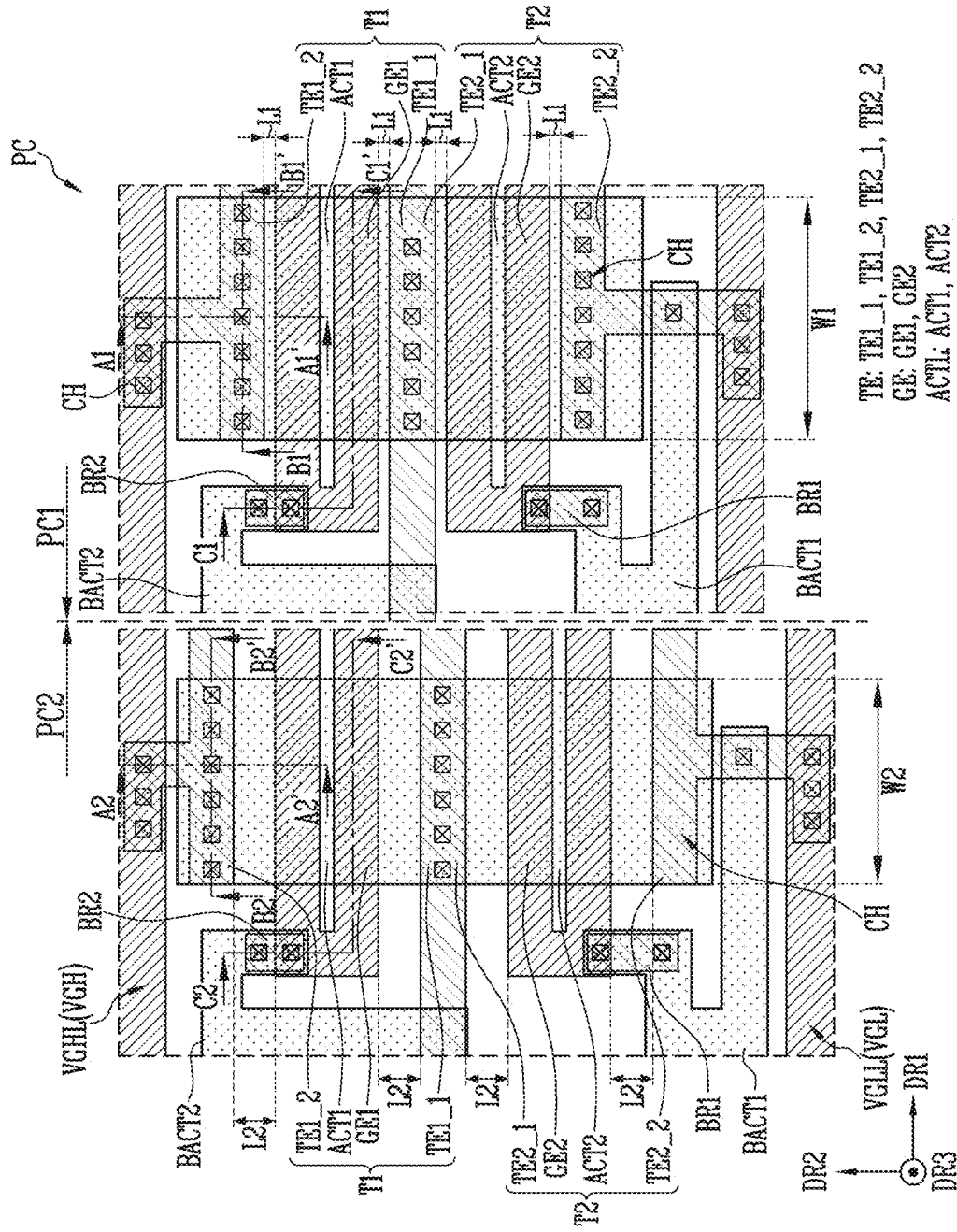
FIG. 10 is a plan view schematically illustrating the first protection circuit and the second protection circuit together according to one or more embodiments.
Figure 11:
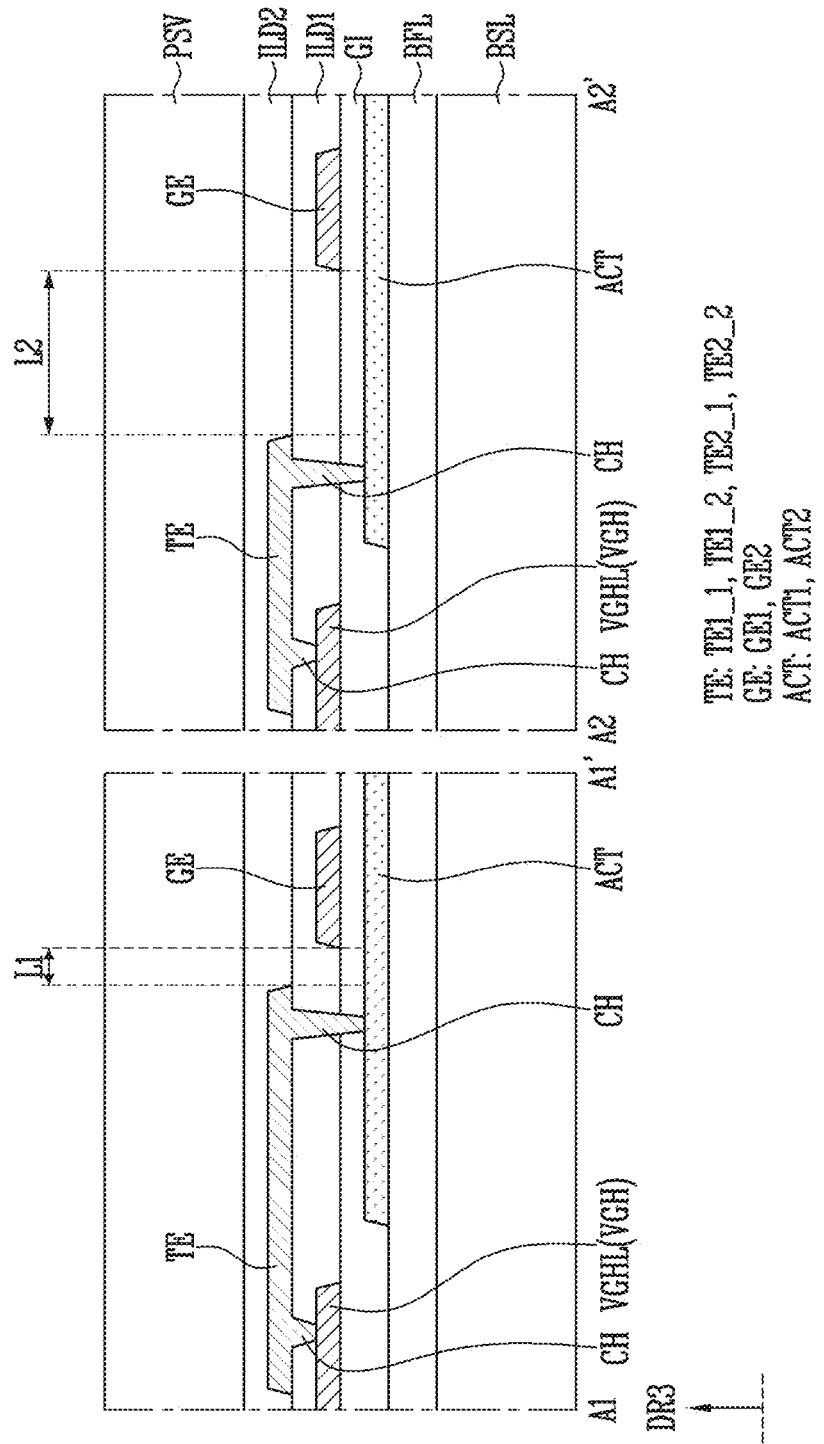
FIG. 11 is a schematic cross-sectional view taken along the lines A1~A1' and A2~A2' in FIG. 10.
Figure 12:
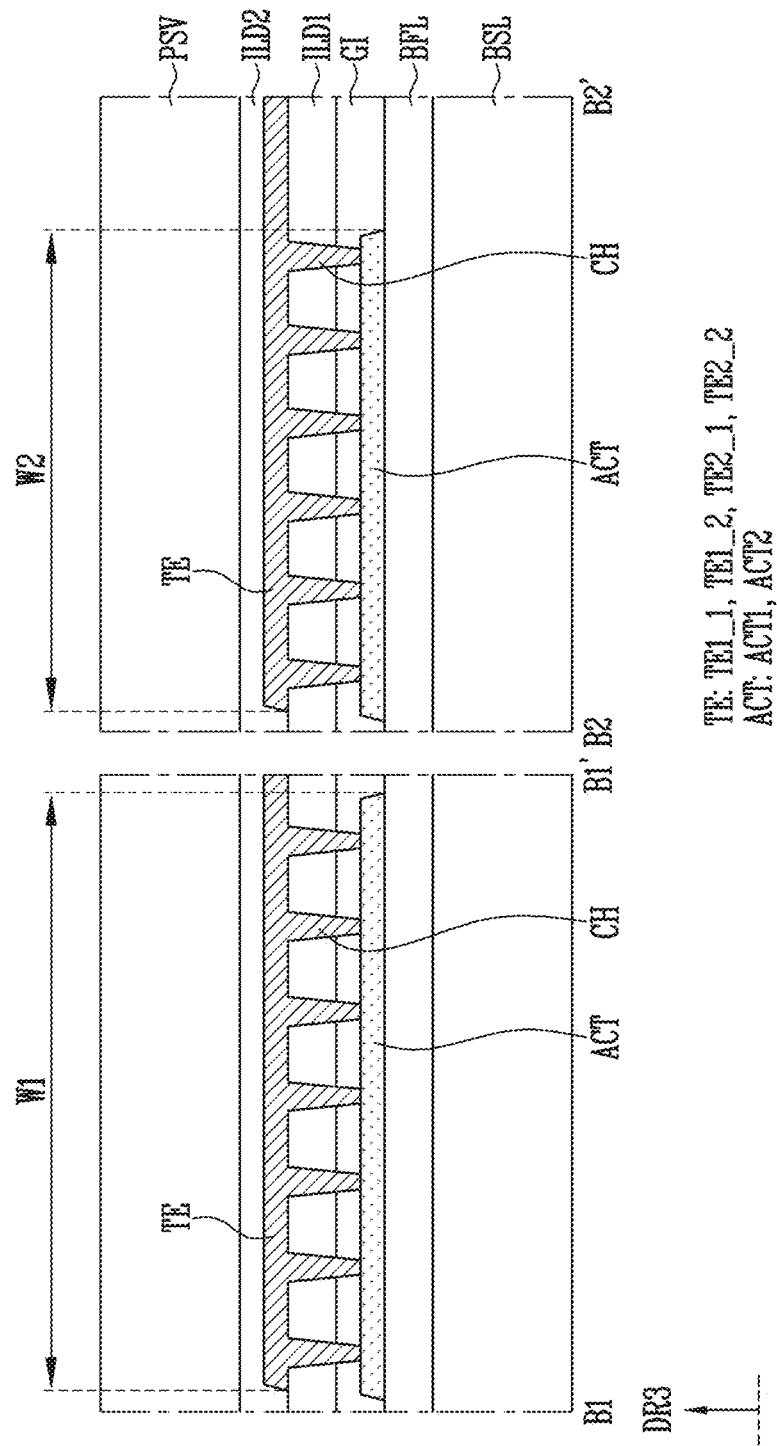
FIG. 12 is a schematic cross-sectional view taken along the lines B1~B1' and B2~B2' in FIG. 10.
Figure 13:
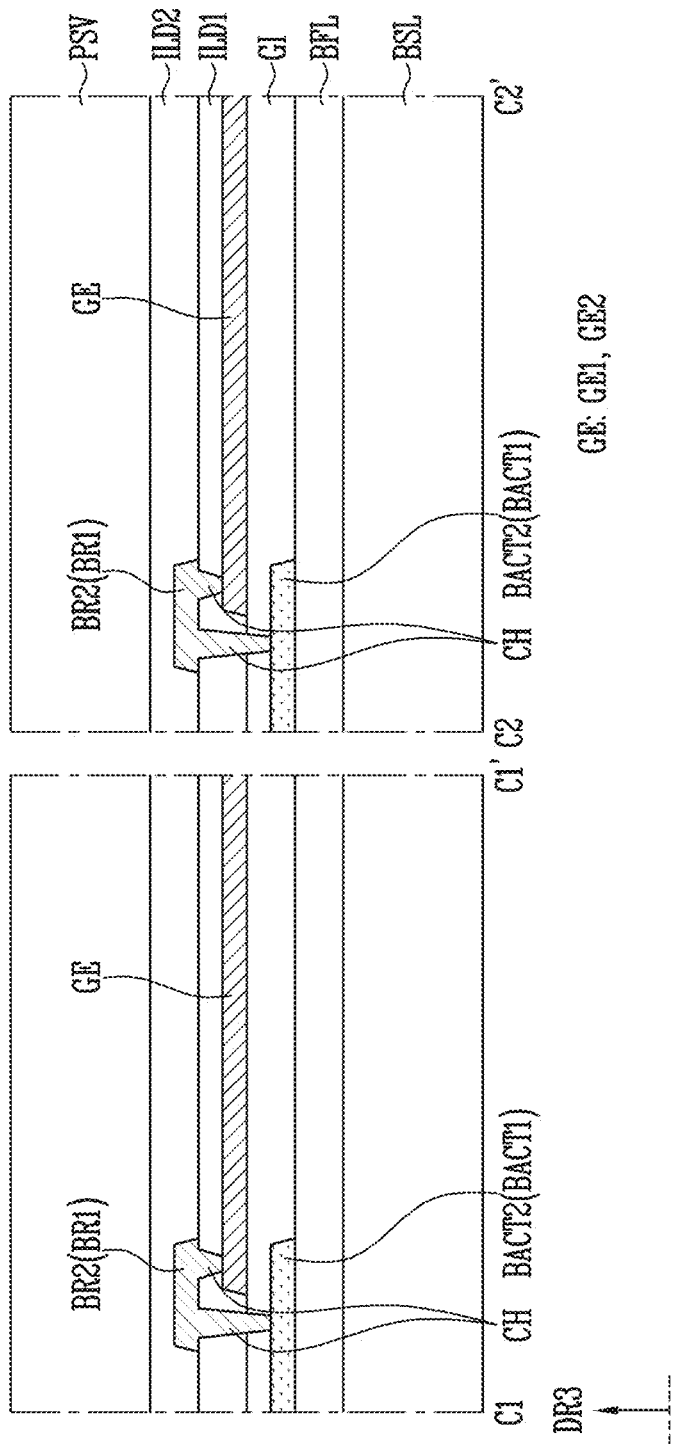
FIG. 13 is a schematic cross-sectional view taken along the lines C1~C1' and C2~C2' in FIG. 10.

FIG. 10 is a plan view schematically illustrating the first protection circuit and the second protection circuit together according to one or more embodiments. FIG. 11 is a schematic cross-sectional view taken along the lines A1~A1' and A2~A2' in FIG. 10. FIG. 12 is a schematic cross-sectional view taken along the lines B1~B1' and B2~B2' in FIG. 10. FIG. 13 is a schematic cross-sectional view taken along the lines C1~C1' and C2~C2' in FIG. 10.

The cross-sectional view of FIG. 11 defined by the cutting line of FIG. 10 shows the (1_2)th transistor electrode TE1_2, the first active layer ACT1, and the first gate electrode GE1 shown in FIG. 10. However, this is for convenience of description, and technical features regarding the length relationship may be applied to the other transistor electrodes TE1_1, TE2_1, and TE2_2, the second active layer ACT2, and the second gate electrode GE2. Accordingly, reference numerals of the transistor electrode TE, the gate electrode GE, and the active layer ACT are generally shown in FIG. 11.

The cross-sectional view of FIG. 12 defined by the cutting line of FIG. 10 shows the (1_2)th transistor electrode TE1_2 and the first active layer ACT1 shown in FIG. 10. However, this is for convenience of description, and technical features regarding the width relationship may be applied to other transistor electrodes TE1_1, TE2_1, and TE2_2 and the second active layer ACT2. Accordingly, reference numerals of the transistor electrode TE and the active layer ACT are generally shown in FIG. 12.

Although a cross-sectional structure of the second transistor T2 is shown in FIGS. 11 to 13, technical features corresponding thereto may also be applied to the first transistor T1.

Referring to FIGS. 10 to 13, the first protection circuit PC1 and the second protection circuit PC2 may have different electrode structures.

For example, an interval between electrodes constituting the first protection circuit PC1 electrically connected to the first pad PAD_D for transmitting the data signal may be different from an interval between electrodes constituting the second protection circuit PC2 electrically connected to the second pad PAD_G for transmitting the gate control signal, the gate power source voltage, and the like.

For example, widths of the active layers ACT1 and ACT2 of the transistors T1 and T2 constituting the first protection circuit PC1 may be different from widths of the active layers ACT1 and ACT2 of the transistors T1 and T2 constituting the second protection circuit PC2.

According to one or more embodiments, ESD protection performance of the protection circuits PC can be optimized by designing the structures of the protection circuits PC differently according to the types of electrical signals applied by the pads PAD, and the ESD protection performance of the protection circuits PC whose performance may be deteriorated can be compensated for. For example, because a large amount of electrical signal is applied to a current path electrically connected to the first pad PAD_D supplying the data signal, when the protection circuits PC are manufactured in a uniform pattern, it may be difficult for the first protection circuit PC1 to sufficiently exhibit static electricity prevention performance. However, according to one or more embodiments, because the structure of the first protection circuit PC1 a"d th' structure of the second protection circuit PC2 may be designed differently, the ESD protection performance of the protection circuits PC can be optimized. Hereinafter, the electrode structure will be described in detail.

Referring to FIGS. 10 and 11, in the first protection circuit PC1 and the second protection circuit PC2, distances between the transistor electrodes TE and the gate electrode GE of the transistors T1 and T2 may be different from each other. Here, each of the transistor electrodes TE may be the source electrode or the drain electrode of the first transistor T1 or the second transistor T2, and may be one of the (1_1)th transistor electrode TE1_1, the (1_2)th transistor electrode TE1_2, the (2_1)th transistor electrode TE2_1, and the (2_2)th transistor electrode TE2_2. The gate electrode GE may be one of the first gate electrode GE1 and the second gate electrode GE2.

For example, in the first protection circuit PC1, the (1_2)th transistor electrode TE1_2 and the first gate electrode GE1 may be spaced apart from each other by a first distance L1 in a plan view. Similarly, the (1_1)th transistor electrode TE1_1 and the first gate electrode GE1 may be spaced apart from each other by the first distance L1. Similarly, the (2_2)th transistor electrode TE2_2 and the second gate electrode GE2 may be spaced apart from each other by the first distance L1. Similarly, the (2_1)th transistor electrode TE2_1 and the second gate electrode GE1 may be spaced apart from each other by the first distance L1.

In the second protection circuit PC2, the (1_2)th transistor electrode TE1_2 and the first gate electrode GE1 may be spaced apart from each other by a second distance L2 in a plan view. Similarly, the (1_1)th transistor electrode TE1_1 and the first gate electrode GE1 may be spaced apart from each other by the second distance L2. Similarly, the (2_2)th transistor electrode TE2_2 and the second gate electrode GE2 may be spaced apart from each other by the second distance L2. Similarly, the (2_1)th transistor electrode TE2_1 and the second gate electrode GE1 may be spaced apart from each other by the second distance L2.

According to one or more embodiments, the first distance L1 may be less than the second distance L2.

In this case, a length of a current path formed in the first protection circuit PC1 may be shorter than a length of a current path formed in the second protection circuit PC2. For example, because an electrical signal (for example, current for electrostatic discharge) may move between the transistor electrodes TE in each of the protection circuits PC1 and PC2, the length of the current path can be controlled without adjusting the width of the gate electrode GE by adjusting the distance between the transistor electrodes TE and the gate electrodes GE. In this case, as the length of the current path decreases, a resistance value in the current path defined in the first protection circuit PC1 may be smaller than a resistance value in the current path defined in the second protection circuit PC2.

According to one or more embodiments, the first distance L1 may be 0.5 µm to 5.5 µm. According to one or more embodiments, the first distance L1 may be 1.0 µm to 4.5 µm. According to one or more embodiments, the first distance L1 may be 1.5 µm to 4.0 µm. According to one or more embodiments, the second distance L2 may be 5.0 µm to 8.5 µm. According to one or more embodiments, the second distance L2 may be 5.5 µm to 8.0 µm. According to one or more embodiments, the second distance L2 may be 6.0 µm to 7.5 µm. However, embodiments according to the present disclosure are not necessarily limited thereto.

Referring to FIGS. 10 and 12, widths of the active layers ACT in the first protection circuit PC1 and the second protection circuit PC2 may be different from each other.

For example, in the first protection circuit PC1, the first active layer ACT1 may have a first width W1 along the first direction DR1. Similarly, the second active layer ACT2 may have the first width W1 along the first direction DR1. A direction in which the first width W1 is defined may be different from a direction in which the transistor electrodes TE serving as the source electrode or the drain electrode are spaced apart from each other (for example, the second direction DR2).

According to one or more embodiments, the first width W1 may refer to a width of a region in which the contact members CH formed in each of the first active layer ACT1 and the second active layer ACT2 in the first protection circuit PC1 and electrically connect to the transistor electrodes TE are arranged.

In the second protection circuit PC2, the first active layer ACT1 may have a second width W2 along the first direction DR1. Similarly, the second active layer ACT2 may have the second width W2 along the first direction DR1. A direction in which the second width W2 is defined may be different from a direction in which the transistor electrodes TE serving as the source electrode or the drain electrode are spaced apart from each other (for example, the second direction DR2).

According to one or more embodiments, the second width W2 may refer to a width of a region in which the contact members CH formed in each of the first active layer ACT1 and the second active layer ACT2 in the second protection circuit PC2 and electrically connected to the transistor electrodes TE are arranged.

According to one or more embodiments, the first width W1 may be greater than the second width W2.

In this case, a width of the current path formed in the first protection circuit PC1 may be greater than a width of the current path formed in the second protection circuit PC2. For example, because an electrical signal (for example, current for electrostatic discharge) may move through the active layer ACT between the transistor electrodes TE in each of the protection circuits PC1 and PC2, the width of the current path can be controlled by adjusting the width of the active layer ACT (for example, a width of the region where the contact members CH electrically connecting the active layer ACT and the transistor electrode TE are arranged). In this case, the width of the current path may be reduced, and the resistance value in the current path defined in the first protection circuit PC1 may be smaller than the resistance value in the current path defined in the second protection circuit PC2.

According to one or more embodiments, the first width W1 may be 40.0 µm to 90.0 µm. According to one or more embodiments, the first width W1 may be 45.0 µm to 80.0 µm. According to one or more embodiments, the first width W1 may be 49.0 µm to 76.0 µm. According to one or more embodiments, the second width W2 may be 7.0 µm to 18.0 µm. According to one or more embodiments, the second width W2 may be 9.0 µm to 16.0 µm. According to one or more embodiments, the second width W2 may be 11.0 µm to 14.0 µm. However, embodiments according to the present disclosure are not necessarily limited thereto.

Meanwhile, referring to FIGS. 10 and 13, in each of the first protection circuit PC1 and the second protection circuit PC2, the first gate electrode GE1 may be electrically connected to a first bridge active pattern BACT1 through a first bridge pattern BR1 formed of the second interlayer conductive layer ICL2, the first bridge active pattern BACT1 may be electrically connected to a portion extending from the (1_2)th transistor electrode TE1_2 through the contact member CH, and may be electrically connected to the second gate power source line VGLL. In each of the first protection circuit PC1 and the second protection circuit PC2, the second gate electrode GE2 may be electrically connected to a second bridge active pattern BACT2 through a second bridge pattern BR2 formed of the second interlayer conductive layer ICL2, the second bridge active pattern BACT2 may be electrically connected to a portion extending from the (2_2)th transistor electrode (TE2_2) through the contact member CH, and may be electrically connected to the first gate power source line VGHL. Accordingly, each of the first protection circuit PC1 and the second protection circuit PC2 may be electrically connected to the first gate power source line VGHL and the second gate power source line VGLL.

As described above, according to one or more embodiments, reliability of the ESD protection performance of the entire protection circuit PC may be reconsidered by differently designing the structure of some of first protection circuits PC1. In this case, because the structures of the second protection circuits PC2 may not be changed and only the structures of some of the first protection circuits PC1 are changed, the convenience of process design may be increased.

According to the embodiments of the disclosure, a display device in which a risk due to static electricity can be substantially prevented or reduced by optimizing a static electricity protection circuit can be provided.

As described above, aspects of some embodiments of the disclosure have been disclosed through the detailed description and the drawings. However, those skilled in the art or those of ordinary skill in the art will appreciate that various modifications and changes are possible without departing from the spirit and technical scope of the disclosure as set forth in the claims below.

Therefore, the technical protection scope of embodiments according to the present disclosure are not limited to the detailed description described in the specification, but should be determined by the appended claims, and their equivalents.

What is claimed is:

1. A display device comprising:
 a pixel on a base layer;
 a gate driver configured to supply a first gate control signal to the pixel through a gate line;
 pads including a first pad on the base layer and electrically connected to the pixel through a data line, and a second pad on the base layer and electrically connected to the gate driver; and
 a protection circuit electrically connected to the pads,
 wherein the protection circuit includes a first protection circuit electrically connected between the first pad and the pixel, and a second protection circuit electrically connected between the second pad and the gate driver, and
 wherein the first protection circuit and the second protection circuit have different structures,
 wherein the first protection circuit includes a protection transistor and a transistor electrode of the protection transistor and a gate electrode of the protection transistor are spaced apart from each other by a first distance in a plan view,
 wherein the second protection circuit includes a protection transistor and a transistor electrode of the protection transistor and a gate electrode of the protection transistor are spaced apart from each other by a second distance in the plan view, and
 wherein the first distance is smaller than the second distance.

2. The display device of claim 1, wherein the first pad is configured to provide a data signal to the pixel through the data line, and
 wherein the second pad is configured to provide a second gate control signal to the gate driver through a gate control line.

3. The display device of claim 2, wherein the second protection circuit is electrically connected to the gate driver through the gate control line.

4. The display device of claim 2, wherein the first protection circuit is electrically connected to the pixel through the data line.

5. The display device of claim 2, wherein the gate driver includes a stage, a first gate power source line, a second gate power source line, a clock signal line, and a start signal line,
 wherein the stage is electrically connected to the first gate power source line, the second gate power source line, the clock signal line, and the start signal line,
 wherein the stage is configured to supply a gate signal to the gate line,
 wherein a first gate power source voltage is configured to be applied to the first gate power source line,
 wherein a second gate power source voltage is configured to be applied to the second gate power source line,
 wherein a clock signal is configured to be applied to the clock signal line, and
 wherein a start signal is configured to be applied to the start signal line.

6. The display device of claim 5, wherein the clock signal line is electrically connected to the second protection circuit.

7. The display device of claim 5, wherein the start signal line is electrically connected to the second protection circuit.

8. The display device of claim 5, wherein the protection circuit includes the protection transistor of the first protection circuit including a first transistor and a second transistor,
 wherein the first gate power source line is electrically connected to the first transistor, and
 wherein the second gate power source line is electrically connected to the second transistor.

9. The display device of claim 8, wherein in the first protection circuit, an active layer of the protection transistor has a first width,
 wherein in the second protection circuit, an active layer of the protection transistor has a second width, and
 wherein the first width is greater than the second width.

10. The display device of claim 9, wherein the first width is a width of a region in which first contact members for electrically connecting the active layer and a transistor electrode of the protection transistor in the first protection circuit are arranged, and
 wherein the second width is a width of a region in which second contact members for electrically connecting the active layer and the transistor electrode of the protection transistor in the second protection circuit are arranged.

11. The display device of claim 9, wherein the first width and the second width are defined according to a direction different from a direction in which a source electrode and a drain electrode of the protection transistor are spaced apart from each other.

12. The display device of claim 9, wherein the first width is in a range of 40.0 micrometers (μm) to 90.0 μm and the second width is in a range of 7.0 μm to 18.0 μm.

13. The display device of claim 1, wherein the first distance is in a range of 0.5 micrometers (μm) to 5.5 μm and the second distance is 5.0 μm to 8.5 μm.

14. The display device of claim 1, wherein the protection circuit is configured to receive a signal in the form of a pulse to discharge static electricity introduced into the pads.

* * * * *